US012748309B2

(12) United States Patent
Oudenhoven et al.

(10) Patent No.: US 12,748,309 B2
(45) Date of Patent: Sep. 29, 2026

(54) ELECTRONIC DEVICES WITH SENSORS

(71) Applicant: Apple Inc., Cupertino, CA (US)

(72) Inventors: Michael J Oudenhoven, San Francisco, CA (US); Brian S Lau, Sacramento, CA (US); Jonathan M Anderson, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 442 days.

(21) Appl. No.: 18/334,999

(22) Filed: Jun. 14, 2023

(65) Prior Publication Data

US 2024/0027772 A1 Jan. 25, 2024

Related U.S. Application Data

(60) Provisional application No. 63/390,835, filed on Jul. 20, 2022.

(51) Int. Cl.
*G02B 27/01* (2006.01)
*H03K 17/96* (2006.01)

(52) U.S. Cl.
CPC ..... *G02B 27/0172* (2013.01); *G02B 27/0176* (2013.01); *H03K 17/962* (2013.01); *G02B 2027/0154* (2013.01)

(58) Field of Classification Search
CPC ............ G02B 27/0172; G02B 27/0176; G02B 2027/0154; G02B 27/0179; G02B 2027/0181; D03D 1/0088
See application file for complete search history.

(56) References Cited

U.S. PATENT DOCUMENTS

| | | | | |
|---|---|---|---|---|
| 10,133,316 | B1 | 11/2018 | Wong | |
| 10,416,451 | B2 | 9/2019 | Tannoudji et al. | |
| 10,823,970 | B2 | 11/2020 | Franklin et al. | |
| 11,064,188 | B2 | 7/2021 | Lin et al. | |
| 11,292,236 | B1 * | 4/2022 | Wang | G06F 1/1675 |
| 11,860,444 | B2 * | 1/2024 | Tao | G02B 7/12 |
| 2013/0050642 | A1 | 2/2013 | Lewis et al. | |
| 2018/0348863 | A1 * | 12/2018 | Aimone | G06F 3/016 |
| 2020/0064635 | A1 * | 2/2020 | Franklin | G02B 27/0955 |

(Continued)

FOREIGN PATENT DOCUMENTS

WO 2020222752 A1 11/2020

*Primary Examiner* — Thomas K Pham
*Assistant Examiner* — Ruby L Kauffman
(74) *Attorney, Agent, or Firm* — Treyz Law Group, P.C.; Kendall P. Woodruff

(57) ABSTRACT

Electronic devices such as head-mounted electronic devices may include displays for presenting images to users. To accommodate variations in the interpupillary distances associated with different users, a head-mounted device may have actuators that move left-eye and right-eye optical modules with respect to each other. To hide internal structures from view, the rear of a head-mounted device may be provided with a cover. Capacitance sensor circuitry and/or switch-based sensor circuitry may use electrodes to measure nose contact arising from movement of the optical modules towards each other against the sides of a user's nose. The actuators may be halted or may otherwise be moved in response to sensor measurements, thereby avoiding undesired nose pressure as the optical modules are moved towards each other to accommodate a user's interpupillary distance.

15 Claims, 5 Drawing Sheets

(56) References Cited

U.S. PATENT DOCUMENTS

| | | | | |
|---|---|---|---|---|
| 2020/0233220 | A1* | 7/2020 | Strongwater | G06F 3/011 |
| 2021/0325678 | A1* | 10/2021 | Maric | G02B 27/0176 |
| 2023/0375801 | A1* | 11/2023 | Maric | G02B 7/12 |
| 2023/0418019 | A1* | 12/2023 | Birnschein | G06F 1/163 |

* cited by examiner

ELECTRONIC DEVICES WITH SENSORS

This application claims the benefit of provisional patent application No. 63/390,835, filed Jul. 20, 2022, which is hereby incorporated by reference herein in its entirety.

FIELD

This relates generally to electronic devices, and, more particularly, to wearable electronic devices such as head-mounted devices.

BACKGROUND

Electronic devices such as head-mounted devices are configured to be worn on a head of a user. A head-mounted device may have left and right optical systems for presenting images to a user's left and right eyes. Not all users have the same physical distance separating their eyes. To accommodate differences in interpupillary distance between different users, a head-mounted device may have a mechanism for adjusting the positions of the left and right optical systems.

SUMMARY

Electronic devices such as head-mounted electronic devices may include displays for presenting images to users. To accommodate variations in the interpupillary distances associated with different users, a head-mounted device may have actuators that move left-eye and right-eye optical modules with respect to each other. To hide internal structures from view, the rear of a head-mounted device may be provided with a cover.

Capacitive sensor circuitry and/or switch-based sensor circuitry may use electrodes to measure nose pressure arising from movement of the optical modules towards each other against the sides of a user's nose. The actuators may halt movement of the optical modules towards each other based on sensor measurements, thereby avoiding undesired nose pressure as the optical modules are adjusted to accommodate a user's interpupillary distance.

DETAILED DESCRIPTION

An electronic device such as a head-mounted device may have a front face that faces away from a user's head and may have an opposing rear face that faces the user's head. Optical modules on the rear face may be used to provide images to a user's eyes. The positions of the optical modules may be adjusted to accommodate different user interpupillary distances. Internal device structures may be hidden from view by the user by covering the rear face of the device with a curtain. The curtain, which may sometimes be referred to as a cover, covering structure, rear housing cover, rear housing wall, rear housing structure, cosmetic covering, etc., may help block potentially unsightly internal structures from view, while accommodating movement of the optical modules. To ensure that the optical modules do not press too firmly against a user's nose as the optical module positions are adjusted, nose sensor circuitry may be incorporated into the head-mounted device. When a situation is detected in which more than a desired amount of pressure might be applied to a user's nose, the optical modules may be positioned to alleviate this pressure.

Figure 1:
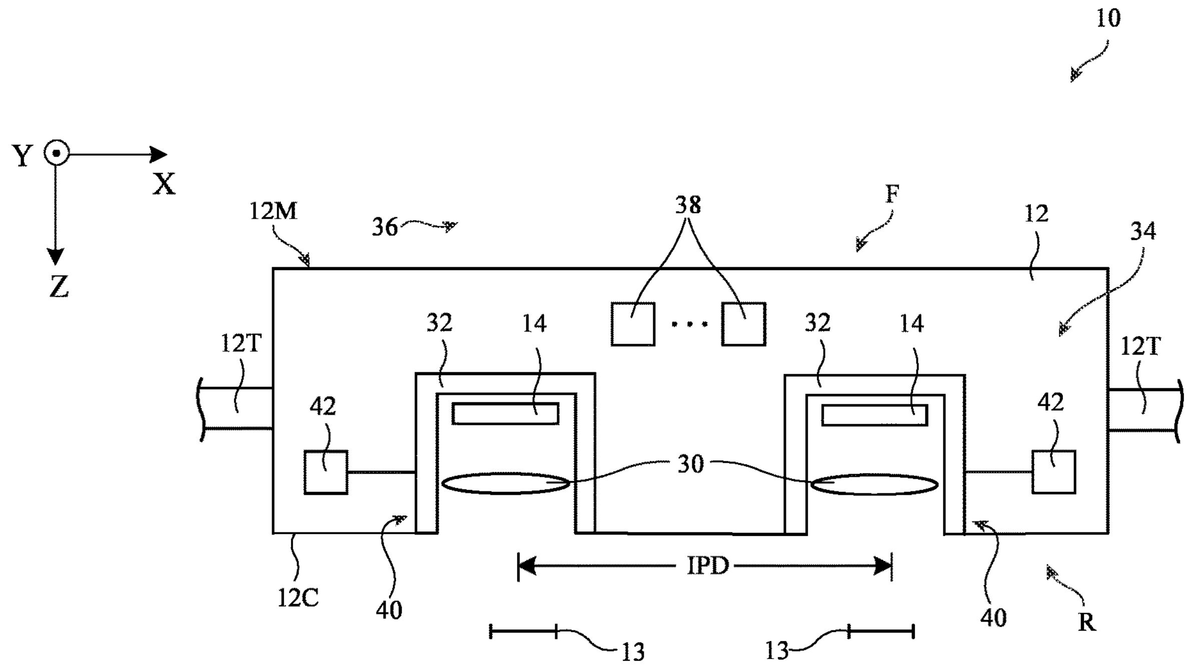
FIG. 1 is a top view of an illustrative head-mounted device in accordance with an embodiment.

A top view of an illustrative head-mounted device with a curtain is shown in FIG. 1. As shown in FIG. 1, head-mounted devices such as electronic device 10 may have head-mounted support structures such as housing 12. Housing 12 may include portions (e.g., support structures 12T) to allow device 10 to be worn on a user's head. Support structures 12T may be formed from fabric, polymer, metal, and/or other material. Support structures 12T may form a strap or other head-mounted support structures that help support device 10 on a user's head. A main support structure (e.g., main housing portion 12M) of housing 12 may support electronic components such as displays 14. Main housing portion 12M may include housing structures formed from metal, polymer, glass, ceramic, and/or other material. For example, housing portion 12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. The walls of housing portion 12M may enclose internal components 38 in interior region 34 of device 10 and may separate interior region 34 from the environment surrounding device 10 (exterior region 36). Internal components 38 may include integrated circuits, actuators, batteries, sensors, and/or other circuits and structures for device 10. Housing 12 may be configured to be worn on a head of a user and may form glasses, a hat, a helmet, goggles, and/or other head-mounted device. Configurations in which housing 12 forms goggles may sometimes be described herein as an example.

Front face F of housing 12 may face outwardly away from a user's head and face. Opposing rear face R of housing 12 may face the user. Portions of housing 12 (e.g., portions of main housing 12M) on rear face R may form a cover such as curtain 12C. In an illustrative configuration, curtain 12C includes a fabric layer that is attached to the rigid support structures of housing 12 and that separates interior region 34 from the exterior region to the rear of device 10. Other structures may be used in forming curtain 12C, if desired. The presence of curtain 12C on rear face R may help hide internal housing structures, internal components 38, and other structures in interior region 34 from view by a user.

Device 10 may have left and right optical modules 40. Each optical module, which may sometimes be referred to as an optical assembly or display and lens support, may include a respective display 14, lens 30, and supporting structures such as support structure (support) 32. Support structure 32, which may sometimes be referred to as lens barrels or optical module support structure, may include hollow cylindrical structures with open ends or other supporting structures to house displays 14 and lenses 30. Support structures 32 of device 10 may, for example, include a left lens barrel that supports a left display 14 and left lens 30 and a right lens barrel that supports a right display 14 and right lens 30. Displays 14 may include arrays of pixels to produce images. Displays 14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images. Lenses 30 may include one or more lens elements for providing image light from displays 14 to respective eyes boxes 13. Lenses may be implemented using refractive glass lens elements, using mirror lens structures (catadioptric lenses), using holographic lenses, and/or other lens systems. When a user's eyes are located in eye boxes 13, displays (display panels) 14 operate together to form a display for device 10 (e.g., the images provided by respective left and right optical modules 40 may be viewed by the user's eyes in eye boxes 13 so that a stereoscopic image is created for the user). The left image from the left optical module fuses with the right image from a right optical module while the display is viewed by the user.

Not all users have the same interpupillary distance IPD. To provide device 10 with the ability to adjust the interpupillary spacing between modules 40 along lateral dimension X and thereby adjust the spacing IPD between eye boxes 13 to accommodate different user interpupillary distances, device 10 may be provided with actuators 42. Actuators 42 can be manually controlled and/or electrically controlled (e.g., actuators 42 may be computer-controlled motors) for moving support structures 32 relative to each other.

Figure 2:
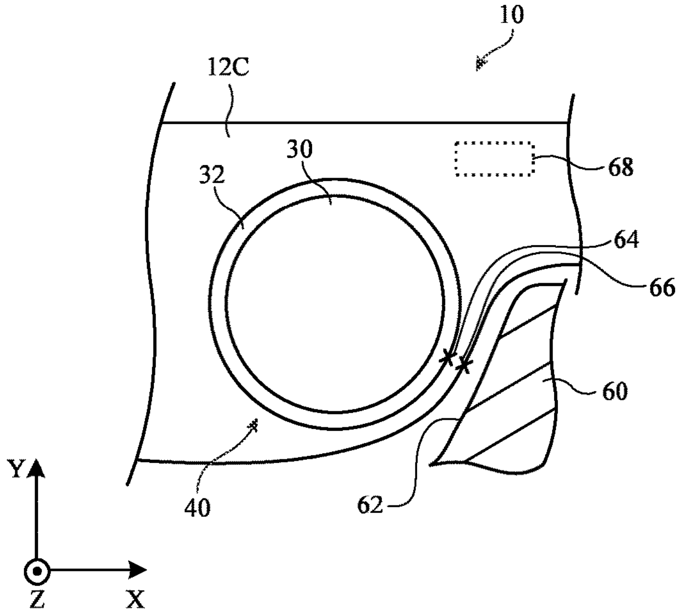
FIG. 2 is a rear view of a portion of an illustrative head-mounted device in accordance with an embodiment.

As shown in FIG. 2, curtain 12C may cover rear face F while leaving lenses 30 of optical modules 40 uncovered (e.g., curtain 12C may have openings that are aligned with and receive modules 40). As modules 40 are moved relative to each other along dimension X to accommodate different interpupillary distances for different users, modules 40 move relative to fixed housing structures such as the walls of main portion 12M and move relative to each other. To prevent undesired wrinkling and buckling of curtain 12C as optical modules 40 are moved relative to rigid portions of housing 12M and relative to each other, a fabric layer or other cover layer in curtain 12C may be configured to slide, stretch, open/close, and/or otherwise adjust to accommodate optical module movement.

Device 10 may make sensor measurements to ascertain a user's IPD. As an example, modules 40 may have rear-facing cameras that can capture images of a user's eyes and thereby determine the spacing between the user's eyes. Using the measured value of IPD for a given user from the cameras or other IPD sensors in device 10, actuators 42 may adjust the spacing between modules 40, so that the modules 40 are spaced apart by the same amount as the user's eyes. Matching the optical module spacing to the user's measured IPD value in this way may help enhance the user's visual comfort while observing content on displays 14.

Although visual comfort may be enhanced by matching optical module spacing to the measured IPD of the user, the shapes of some users' noses is such that optical modules 40 will start to exert undesired amounts of pressure on the nose as modules 40 are brought closer to each other. This undesired excess pressure on the sides of a user's nose may occur before modules 40 are spaced sufficiently close to match a target IPD. To prevent nose discomfort in such situations, capacitive nose sensors, switched-based (resistive) nose sensors, and/or other sensor circuitry may be used by device 10 to detect when the optical modules are contacting the user's nose. When it is determined that optical modules 40 are at risk of pressing too firmly against a user's nose, suitable action can be taken. For example, if a sensor detects contact between a sensor electrode and the surface of the user's nose, actuators 42 can halt the inward movement of modules 40 and/or actuators 42 may move modules 40 slightly away from each other.

As shown in the rear view of the portion of device 10 of FIG. 2, curtain 12C may have an opening to accommodate optical module 40, including lens 30 and lens barrel 32. Curtain 12C and/or other portions of device 10 (e.g., polymer nose bridge portions and/or other rear covering structures, sometimes collectively referred to herein as curtain 12C) may be configured to form a comfortable nose bridge structure that rests on the bridge of nose 60 while device 10 is being worn on a user's head. For some users, portions of side nose surface 62 will be separated by a gap from opposing nose-bridge surface 64 of curtain 12C or will lightly contact surface 62. For other users, there is a risk that optical module 40 and/or associated portions of curtain 12C that are located between module 40 and side nose surface 62 will press uncomfortably against side nose surface 62 (e.g., in the +X direction in the example of FIG. 2). This pressure against nose surface 62 may be created when module 40 is being moved inwardly towards the nose (e.g., in the +X direction in the FIG. 2 example). Modules 40 may, for example, be moved inwardly by actuators 42 when it is desired to reduce the module-to-module spacing in device 10 to accommodate a user's measured IPD. By placing sensor circuitry at locations such as locations 64 and/or 66, conditions leading to uncomfortable nose pressure from optical modules 40 can be avoided.

The sensors that detect nose pressure conditions may be, as examples, capacitive sensors (e.g., capacitive sensors that make capacitance measurements using self-capacitance and/or mutual capacitance measurement techniques) and/or switch-based sensors (e.g., sensors that detect when two electrodes have come into contact with each other to close a circuit by monitoring the resistance between the electrodes). The sensors may have electrodes and associated measurement circuitry. One or more electrodes for making capacitance measurements and/or switch sensor measurements may be located at locations such as locations 64 and/or 66. These electrodes may be coupled to measurement circuitry 68 (e.g., capacitance measurement circuitry or resistance measurement circuitry). During operation, circuitry 68 can use the electrodes at locations such as locations 64 and/or 66 to detect changes in capacitance and/or resistance that are indicative of conditions associated with uncomfortable nose pressure, so that corrective action can be taken.

Figure 3:
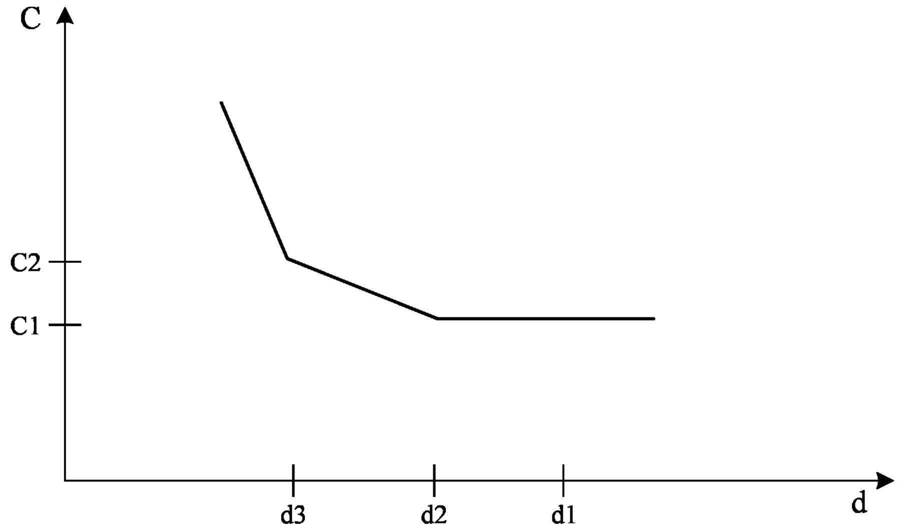
FIG. 3 is a graph of capacitive sensor measurements that may be made using a capacitive sensor in accordance with an embodiment.

FIG. 3 is a graph of an illustrative capacitance measurement of the type that may be made by a capacitive nose sensor. Initially, when nose surface 62 is experiencing little or no pressure from lens barrel 30 (whether directly or through intervening portions of curtain 12C or other nose bridge structures), measured capacitance C may have a first value (see, e.g., capacitance value C1 when the nose is at distance d1 from lens barrel 30). As nose surface 62 comes closer to lens barrel 30 (e.g., when the nose is at distance d2 from lens barrel 30 as optical module spacing is adjusted to accommodate the user's IPD), the measured capacitance C may start to rise from C1 to C2. Capacitances C1 to C2 may, for example, represent capacitance values that are measured at a distance (e.g., capacitance proximity sensor measurements). As capacitance C starts to rise from C1 to C2 (e.g., at distances between d1 and d2 where the capacitive sensor is operating as a capacitive proximity sensor), it can be determined that nose surface 62 is approaching close to lens barrel 30. In response, the speed at which actuators 42 are reducing the spacing between optical modules 40 may optionally be reduced to avoid an abrupt impact with the user's nose. When distance d decreases to d3, nose surface 62 contacts lens barrel 30 and/or otherwise experiences significantly increasing pressure from lens barrel 30. At this point, measured capacitance C increases abruptly above C2. Upon detecting the abrupt increase in capacitance at distance d3, further movement of modules 40 can be halted (and, if desired, the spacing of modules 40 can be increased slightly to back off from distance d3 before stopping further movement of module 40). In this way, nose contact information from the capacitive sensor can be used to determine when pressure on nose surface 62 has reached its maximum comfortable level and can prevent excessive narrowing of the module-to-module spacing in device 10 in an attempt to match a user's narrow IPD.

Figure 4:
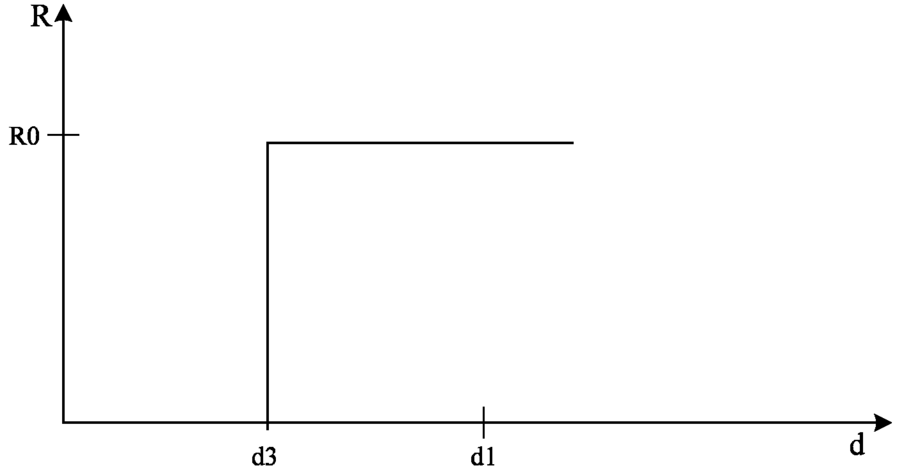
FIG. 4 is a graph of resistance measurements that may be made using a switch-based sensor in accordance with an embodiment.

Switch-based sensor measurements are illustrated in the graph of FIG. 4. As shown in FIG. 4, the measured resistance R across a pair of switch electrodes is relatively high (e.g., value RO) when the electrodes are not in contact and the switch formed from the switch electrodes is open). This occurs when lens barrel 30 is sufficiently far from nose surface 62 (e.g., when the nose is at a distance d1 from lens barrel 30). When distance d between nose surface 62 and lens barrel 30 decreases to distance d3, the electrodes of the switch sensor are pressed together, and the measured resistance drops significantly (e.g., to 0, corresponding to a closing of the switch formed by the electrodes). The switch-based sensor (sometimes referred to as a switch, switch sensor, or resistive sensor) can then conclude that lens barrel 30 is pressing against nose 60 and further motion of modules 40 towards each other may be halted (and, if desired, the spacing of modules 40 may be slightly backed off before module motion is stopped).

As these examples demonstrate, capacitive nose sensors and switch-based nose sensors can detect pressure on nose 60 and can adjust the movement of optical modules 40 accordingly to prevent uncomfortable amounts of pressure.

Figure 5:
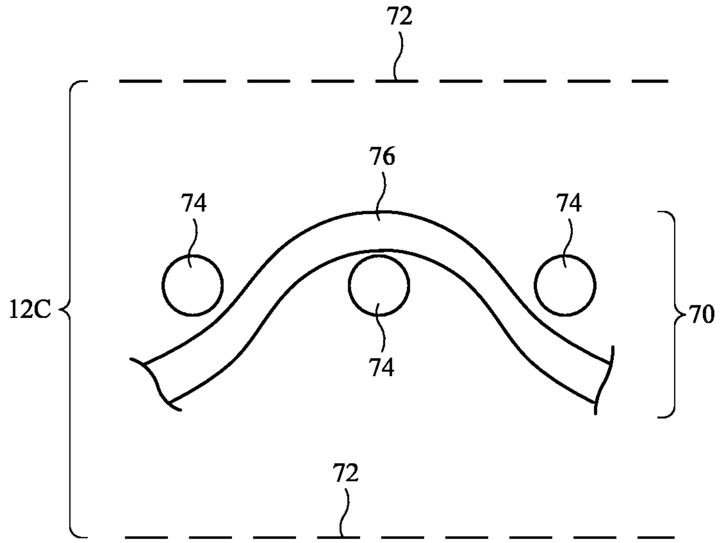
FIG. 5 is a cross-sectional side view of an illustrative curtain formed from fabric in accordance with an embodiment.

Electrodes for capacitive and switch-based sensors may be formed from conductive structures (e.g., metal foil, metal paint, metal wire, conductive polymer, and/or other suitable conductive structures formed from metal and/or other conductive material). Consider, as an example, the cross-sectional side view of the portion of curtain 12C in FIG. 5. As shown in FIG. 5, curtain 12C may have one or more layers of fabric such as fabric layer 70. Curtain 12C may also have additional optional layers 72 (e.g., fabric layers and/or layers of other material such as layers of polymer, etc.). The fabric of curtain 12C may be knit fabric or woven fabric or other suitable fabric. In the example of FIG. 5, fabric layer 70 includes strands 74 and strands 76. The strands of curtain 12C may include monofilaments and multifilament strands (sometimes referred to as threads). To form a conductive electrode in a particular area of curtain 12C, some or all of the strands in this area may be formed from metal or other conductive material. For example, silver strands (sometimes referred to as silver wires or silver threads) may be incorporated into the fabric of curtain 12C. Silver has antimicrobial properties and therefore may help suppress microbial growth in curtain 12C. Silver is also highly conductive. In arrangements in which conductive strands are used in forming electrodes, the electrodes may be somewhat flexible, thereby helping to enhance user comfort. If desired, other metals and/or other conductive materials may be used in forming one or more electrodes in curtain 12C.

Figure 6:
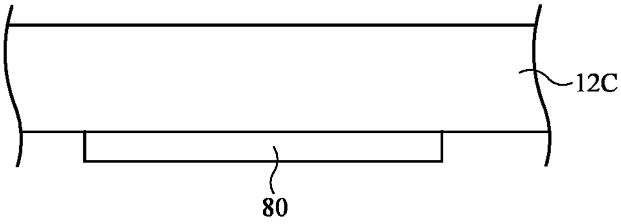
FIG. 6 is a cross-sectional side view of an illustrative curtain with a layer of conductive material forming a sensor electrode in accordance with an embodiment.

As shown in FIG. 6, conductive layer 80 (e.g., a metal layer formed from metal foil, metal paint, or conductive polymer) has been patterned to form a sensor electrode on one of the surfaces of curtain 12C. Conductive layers such as layer 80 may be formed on the inner and/or opposing outer surface of one or more of the fabric layers of curtain 12C and/or on the inner and/or opposing outer surfaces of other layers of material in curtain 12C (e.g., on the inner and/or outer surfaces of a polymer layer in curtain 12C). In the example of FIG. 6, which is illustrative, layer 80 has been patterned to form an electrode on one of the surfaces of curtain 12C (e.g., a fabric layer forming curtain 12C).

Figure 7:
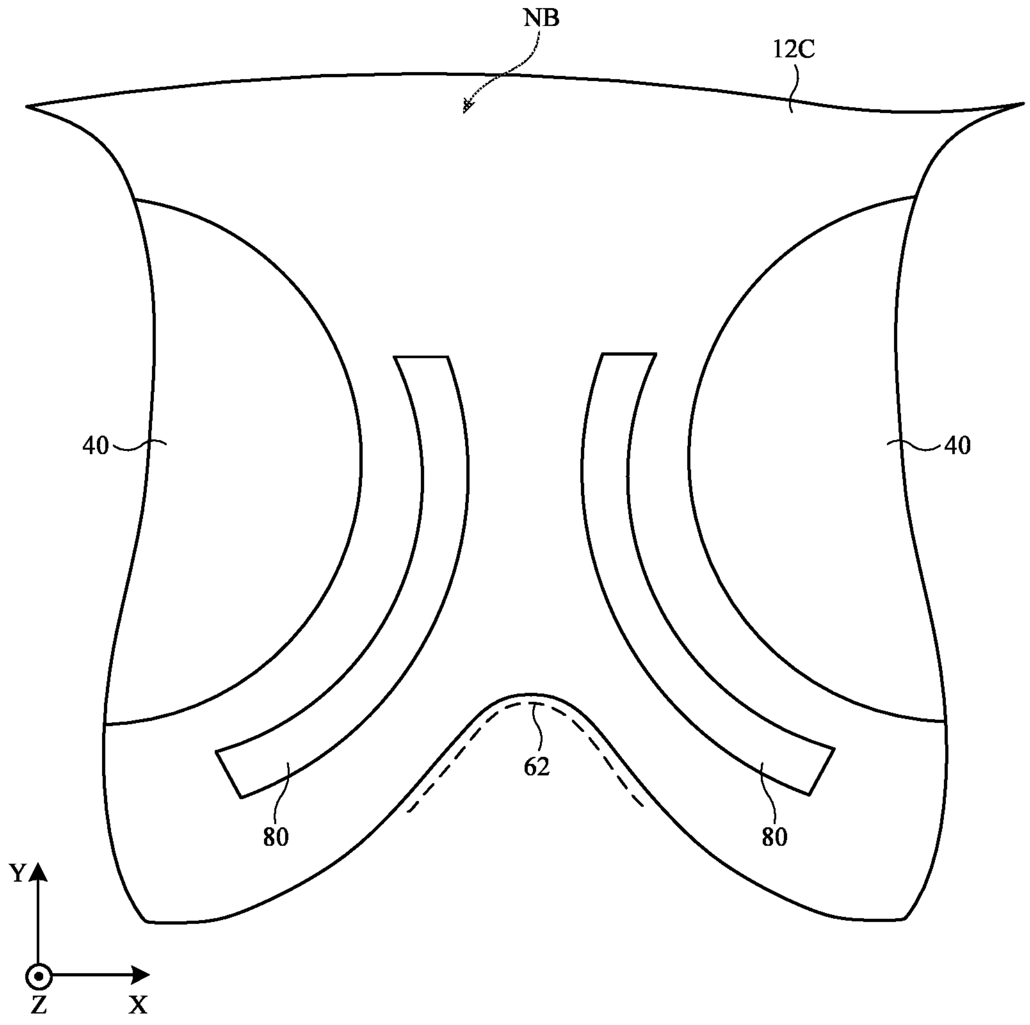
FIG. 7 is a rear view of a portion of a head-mounted device showing illustrative electrode locations on the nose bridge portion of a rear housing cover such as a fabric curtain in accordance with an embodiment.

Electrodes may be incorporated into device 10 so that there are one or more electrodes on either side of the nose (e.g., on opposing sides of the location where the user's nose is received when device is being worn by a user). As shown in the rear view of FIG. 7, electrodes may be formed from elongated strips of conductive material (e.g., conductive strands woven, knit, or otherwise intertwined with the fabric of curtain 12C, metal patches formed from metal foil, metal paint, conductive polymer, and/or other conductive electrode structures). Strip-shaped electrodes of the type shown in FIG. 7 may be straight or may be curved to accommodate the shape of the nose. When optical modules press inwardly on nose surface 62, a capacitive sensor formed using electrodes 80 may measure an increase in capacitance, as described in connection with FIG. 3.

The portion of device 10 that rests on and/or presses against a user's nose surfaces may be formed of the same fabric as other portions of curtain 12C and/or may be a separate structure (sometimes referred to as a nose piece or nose bridge member) that is attached to the fabric of curtain 12C (e.g., a separate polymer nose piece, a polymer frame over which fabric may be stretched, etc.). Sensor electrodes may be mounted on any suitable portion of the rear cover for device 10 (e.g., electrodes may be formed on or in fabric, on or in a polymer rear cover layer and/or nose bridge member, etc.). Illustrative configurations in which electrodes are formed on curtain 12C and/or lens barrel 30 may sometimes be described herein as an example.

Figure 8:
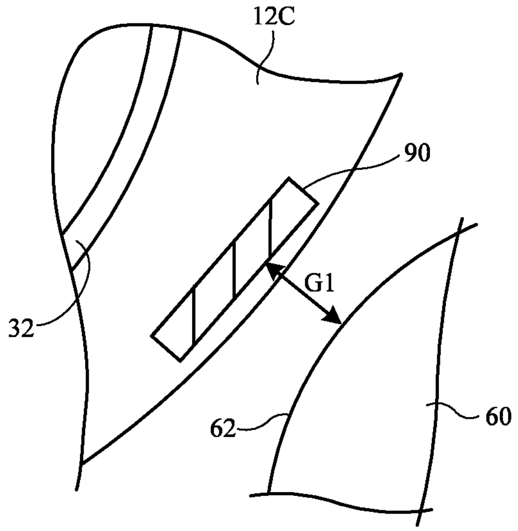
FIGS. 8 and 9 are diagrams showing illustrative electrode placements for sensors in accordance with embodiments.

FIG. 8 is a rear view of a portion of device 10 showing how a sensor electrode such as electrode 90 (e.g., a capacitive sensor electrode) may be located on curtain 12C at a distance G1 from nose 60 and nose surface 62. In this type of arrangement, capacitive sensor measurements may be used to determine from a distance when nose 60 is approaching electrode 90 and lens barrel 30 (e.g., by making optional capacitive proximity sensor measurements with the capacitive sensor formed from electrode 90) and may be used to determine when nose 60 is contacting electrode 90 (e.g., by making capacitive touch sensor measurements with the capacitive sensor formed from electrode 90).

Figure 9:
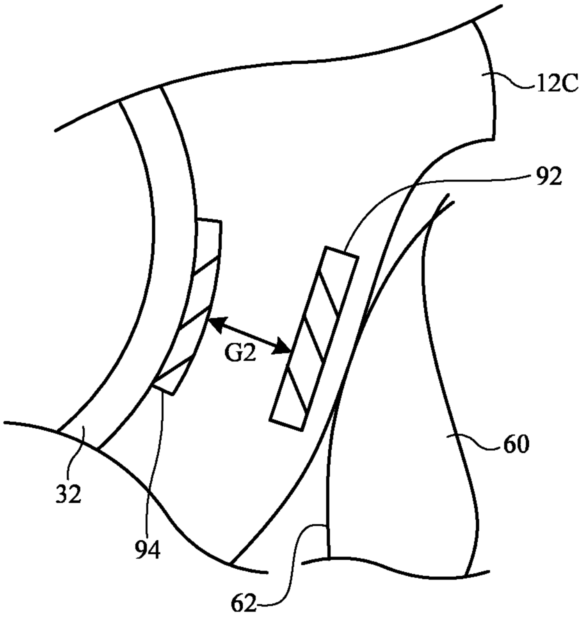

Another illustrative electrode layout is shown in FIG. 9. As shown in FIG. 9, a first electrode (e.g., electrode 94) may be formed on or immediately adjacent to lens barrel 32, whereas a second electrode (e.g., electrode 92) may be formed on curtain 12C (e.g., adjacent to the location for nose 60 when device 10 is being worn). Electrodes 94 and 92 may be separated by a distance G2 that reduces as pressure is applied to the user's nose and curtain 12C stretches to accommodate the user's nose. Capacitance measurement circuitry may measure the capacitance between electrodes 94 and 92 to determine the size of distance G2 as described in connection with FIG. 3 and/or switch-based measurement circuitry may measure the resistance between electrodes 94 and 92 to determine when electrodes 94 and 92 have been forced into contact with each other (e.g., electrodes 94 and 92 may be used in forming a switch sensor as described in connection with FIG. 4).

In general, capacitance and/or switch sensor measurements may be made using electrodes on lens barrel 32 and/or curtain 12C and/or other head-mounted support structures adjacent to the location in which the user's nose is present when device 10 is being worn.

In some embodiments, sensors may gather personal user information. To ensure that the privacy of users is preserved, all applicable privacy regulations should be met or exceeded and best practices for handling of personal user information should be followed. Users may be permitted to control the use of their personal information in accordance with their preferences.

The foregoing is merely illustrative and various modifications can be made to the described embodiments. The foregoing embodiments may be implemented individually or in any combination.

What is claimed is:

1. A head-mounted device, comprising:

a head-mounted housing;

first and second optical assemblies in an interior region of the housing that are configured to provide images respectively to first and second eye boxes;

a housing cover that is configured to block the interior region from view, wherein the housing cover has first and second cover openings that are respectively aligned with the first and second optical assemblies, and wherein the housing cover comprises fabric;

a sensor electrode on a nose-bridge portion of the housing cover, wherein the fabric comprises a stretchable fabric and wherein the sensor electrode comprises conductive strands in the fabric; and an additional sensor electrode on a given one of the first and second optical assemblies.

2. The head-mounted device defined in claim 1 wherein the sensor electrode comprises a capacitive sensor electrode.

3. The head-mounted device defined in claim 1 wherein the sensor electrode comprises a switch-based sensor electrode.

4. The head-mounted device defined in claim 1 further comprising actuators configured to adjust an assembly-to-assembly spacing between the first and second optical assemblies.

5. The head-mounted device defined in claim 4 wherein the actuators are configured to use measurements from the sensor electrode to avoid creating excessive nose pressure due to movement of the first and second optical assemblies.

6. A head-mounted device, comprising:

a housing;

first and second optical assemblies that are supported by the housing and that are configured to display images to first and second respective eye boxes;

first and second actuators configured to respectively move the first and second optical assemblies with respect to each other to accommodate an interpupillary distance;

a capacitive sensor configured to make capacitance measurements, wherein the first and second actuators are configured to halt movement of the first and second optical assemblies towards each other based at least partly on the capacitance measurements; and a fabric curtain coupled to the housing, wherein the capacitive sensor has a first electrode on the fabric curtain and a second electrode on the first optical assembly.

7. The head-mounted device defined in claim 6 wherein the fabric curtain is on a rear of the housing and wherein the first electrode is formed from conductive strands in the fabric curtain.

8. The head-mounted device defined in claim 7 wherein the conductive strands comprise silver wires.

9. The head-mounted device defined in claim 6 wherein the first and second actuators are configured to slow movement of the first and second optical assemblies towards each other based at least partly on the capacitance measurement from the capacitive sensor.

10. A head-mounted device, comprising:

a head-mounted housing;

first and second optical assemblies that are supported by the head-mounted housing and that are configured to display images in first and second respective eye boxes;

at least one actuator configured to move the first and second optical assemblies with respect to each other to accommodate an interpupillary distance;

a sensor having at least first and second electrodes located respectively on the first and second optical assemblies, wherein the actuator is configured to halt movement of the first and second optical assemblies towards each other at least partly based on information from the sensor; and a cover coupled to the head-mounted housing, wherein the sensor further comprises third and fourth electrodes on the cover.

11. The head-mounted device defined in claim 10 wherein the cover comprises fabric and wherein the third and fourth electrodes comprise conductive strands in the fabric.

12. The head-mounted device defined in claim 10 wherein the first optical assembly has a first display, a first lens, and a first lens barrel, wherein the second optical assembly has a second display, and a second lens, and a second lens barrel, and wherein the first and second electrodes are formed, respectively, on the first and second lens barrels.

13. The head-mounted device defined in claim 10 wherein the sensor is configured to make capacitance measurements with the first, second, third, and fourth electrodes.

14. The head-mounted device defined in claim 10 wherein the sensor is a switch-based sensor that is configured to detect when the first and third electrodes have contacted each other and that is configured to detect when the second and fourth electrodes have contacted each other.

15. The head-mounted device defined in claim 1 further comprising measurement circuitry configured to measure a distance between the sensor electrode and the additional sensor electrode.

* * * * *